United States Patent [19]

Shoda et al.

[11] Patent Number: 5,569,938
[45] Date of Patent: Oct. 29, 1996

[54] IMAGING APPARATUS WITH LIGHT PULSES

[75] Inventors: Masahiro Shoda, Gyohda; Keiichi Akagawa, Kamakuru, both of Japan

[73] Assignee: Nikon Corporation, Tokyo, Japan

[21] Appl. No.: 213,424

[22] Filed: Mar. 15, 1994

[30] Foreign Application Priority Data

Mar. 15, 1993 [JP] Japan .................................. 5-078512
Jun. 14, 1993 [JP] Japan .................................. 5-165897

[51] Int. Cl.$^6$ ............................ H01L 27/15; H01L 31/12; H01L 33/00
[52] U.S. Cl. ............................ 257/82; 257/222; 257/229; 257/233; 257/443
[58] Field of Search ................................ 257/233, 232, 257/231, 229, 82, 222, 223, 59, 443, 291, 292

[56] References Cited

U.S. PATENT DOCUMENTS

| | | | |
|---|---|---|---|
| 3,932,775 | 1/1976 | Kosonocky | 257/232 X |
| 4,229,095 | 10/1980 | Mir | 358/300 |
| 4,412,745 | 11/1983 | Ohtomo et al. | 250/237 G |
| 4,484,816 | 11/1984 | Ohtomo et al. | 250/237 G |
| 4,697,200 | 9/1987 | Miyatake | 257/232 X |
| 4,810,901 | 3/1989 | Yamada | 257/232 X |
| 5,229,838 | 7/1993 | Ganz et al. | 356/328 |
| 5,428,392 | 6/1995 | Castro et al. | 348/295 |

*Primary Examiner*—William Mintel
*Attorney, Agent, or Firm*—Keck, Mahin & Cate

[57] ABSTRACT

In an imaging apparatus using a semiconductor imaging device formed of CCDs, light from an object to be imaged is fed to the imaging device selectively by the operation of a light generator. Charges produced by photoelectric conversion elements of the imaging device are read out as an image signal. A control apparatus operates on the light generator and imaging device so that at least one light pulse is fed to the imaging device within one imaging period in which charges are read out of the photoelectric conversion elements to produce an image field. The resulting image signal does not include image fields that have been produced without illumination, and image fields based on a uniform illumination can be obtained.

13 Claims, 9 Drawing Sheets

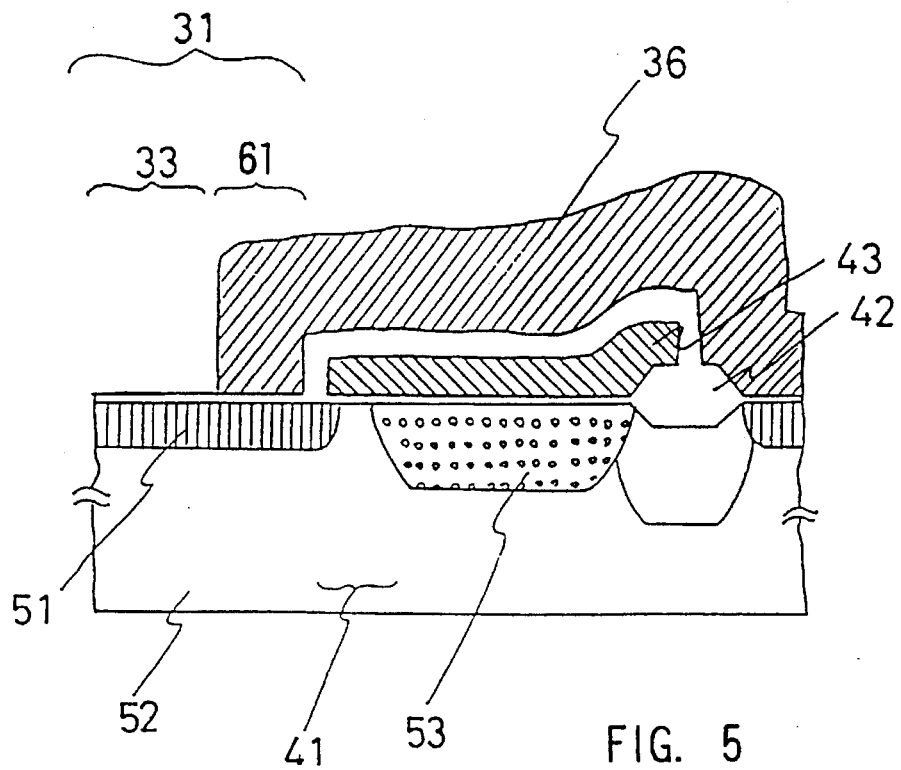
FIG. 5
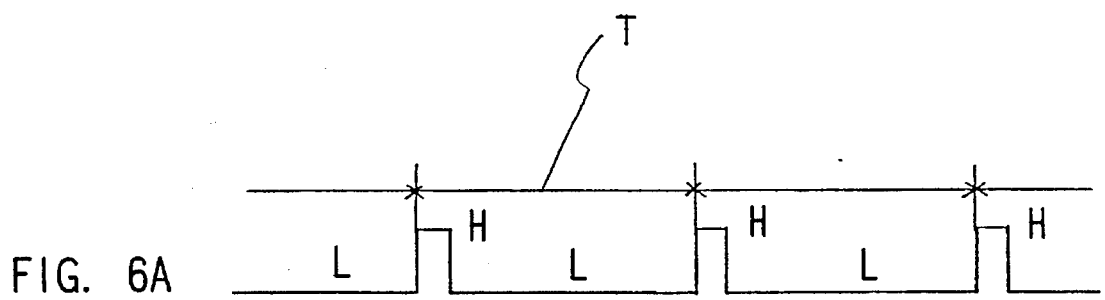
FIG. 6A
FIG. 6B
FIG. 6C
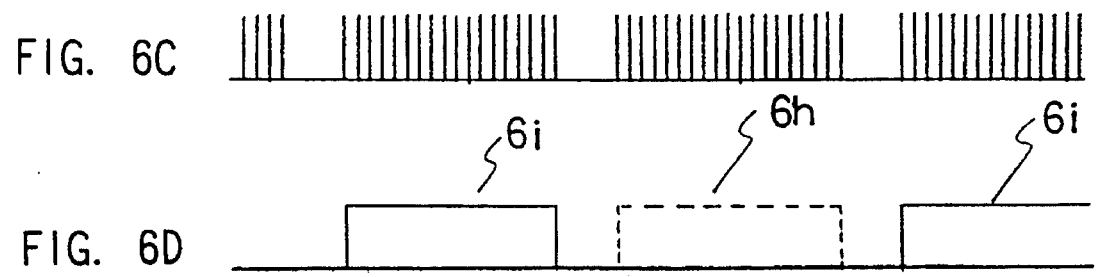
FIG. 6D

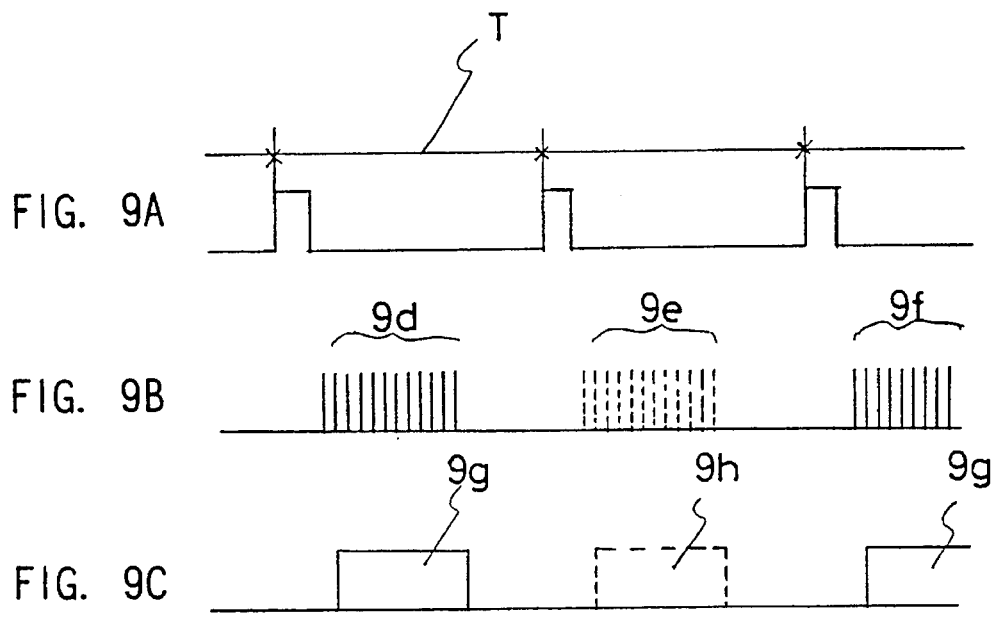
FIG. 9A
FIG. 9B
FIG. 9C
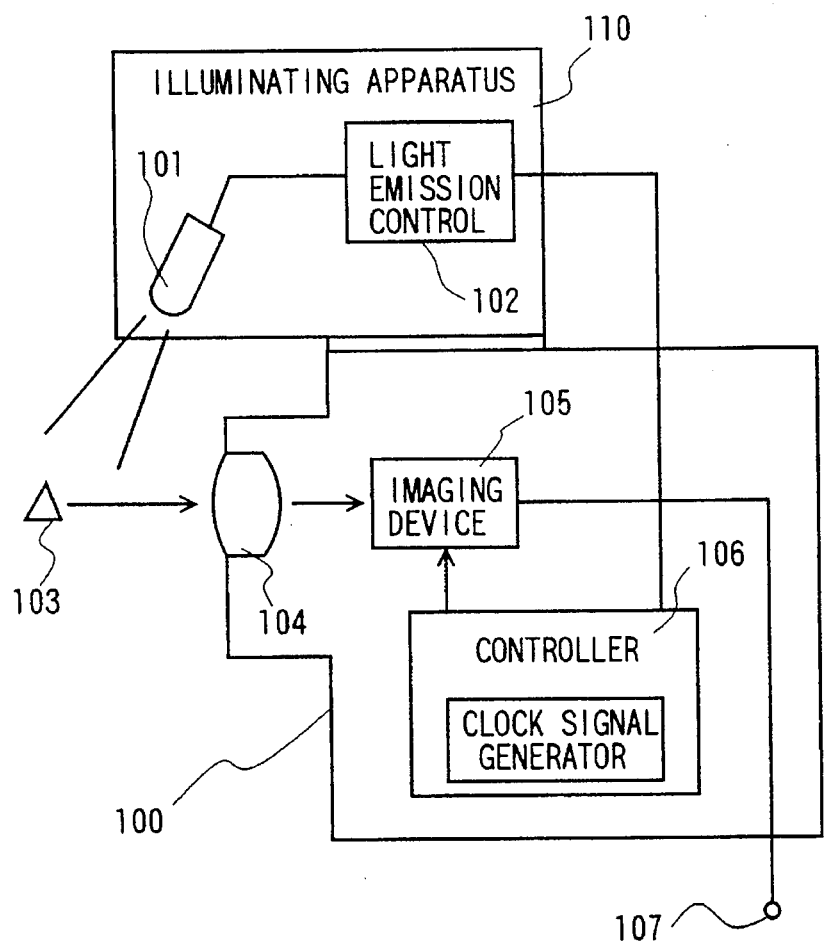
FIG. 10

IMAGING APPARATUS WITH LIGHT PULSES

BACKGROUND OF THE INVENTION

1. Field of the Invention

The present invention relates to an imaging apparatus using an imaging device such as charge coupled device (CCD) or the like 2. Description of Related Art There have been known a variety of semiconductor imaging devices for transforming an optical image formed by an optical system into an electrical image signal. Examples of these devices include CCD and MOS-type image sensors. Conventional semiconductor imaging devices known generally are fabricated on a semiconductor substrate, in which are included a plurality of photoelectric conversion elements and a signal read circuit that reads out charges of images created by the photoelectric conversion elements. The photoelectric conversion elements yield charges in response to light from an object to be imaged, and charges of the photoelectric conversion elements are read out sequentially by the signal read circuit and transferred to an output terminal, from which an image signal is led out. These conventional imaging devices have been used widely in imaging apparatus, in which cases optical images formed by the visible light are rendered into electrical image processings. The conventional semiconductor imaging devices are all intended to record continuous optical information or optical information that varies at an interval up to the period of imaging (one image-field period, e.g., 1/30 second), and they are not suitable for recording pulse-wise optical information having a shorter duration and a longer period than the imaging period of time.

For the observation of the structure of various substances including biological tissues with a microscope, the spatial resolution can be upgraded by using an illumination light with a shorter wavelength. On this account, a pulsed X-ray that is generated when a laser beam is projected to the target metal is used for the illumination light, and a resolution of 1 μm or less is achieved at present.

Conventionally, an observation image produced by the above-mentioned X-ray microscope is recorded on a light-sensitive film by multiple X-ray pulses in a long exposure time, and the exposed film is processed for development. This is very lengthly, delicate and tedious work. Moreover, when the recorded observation image on the film is rendered the electronic image processing for the improvement of image quality or the implementation of various analyses, the developed photographic image needs to be converted into electronic information. This imposes a time gap between the optical observation and image data processing.

As a conceivable solution of the foregoing matter, when a semiconductor imaging device based on CCD or the like is used in place of the photographic film for recording the observation image, the conventional imaging devices encounter the following problems.

The X-ray microscope has an X-ray emission period of about 1/10 second for illumination of an observation object, which is determined from the retention of thermal stability of the pulse laser source, whereas the semiconductor imaging device has an imaging period as short as about 1/30 second. Therefore, when the X-ray microscope is used with the conventional imaging device, it produces images of the illuminated object for some periods among consecutive imaging periods and produces dark images without illumination for the remaining periods. Namely, the brightness of images varies along imaging periods (individual image fields), resulting in an extremely deteriorated image quality. This impropriety is not specific to the recording of observation images of the X-ray microscope, but is a common problem of cases in which a visible or invisible pulsative optical image has a shorter duration and longer period than the imaging period of the imaging device.

The general conventional semiconductor imaging devices have their entire surfaces except for the photoelectric conversion elements, i.e., the surface of the signal read circuit including the vertical charge transfer elements and horizontal charge transfer elements, covered with a light-shielding film. The reason for the need of this light-shielding film for the conventional imaging devices is that if areas other than the photoelectric conversion elements are exposed to the light, noise charges created by it are mixed to signal charges, and the degraded S/N characteristics of the resulting image signal deteriorates the image quality. The signal read circuit may possibly not work when a large amount of light is incident to these areas. The imaging device includes a transfer gate circuit for transferring charges of the photoelectric conversion elements to the vertical charge transfer elements, and this circuit, which is formed of MOS transistors for example near the device surface, also needs to be covered with a light-shielding film.

However, the formation of the above-mentioned light-shielding film on the device surface encounters the following problems.

When a photoelectric conversion element, which is formed by a pn-Junction plane in the semiconductor substrate, is covered at its periphery with a light-shielding film, part of the film penetrates into the pn-junction area, and part of the photoelectric conversion element at the edge of the pn-junction area may possibly not work. This means that the pn-junction plane which works as the photoelectric conversion element has its opening ratio reduced, resulting in a degraded sensitivity of the device.

The manufacturing of imaging devices with the formation of the light-shielding film often suffers a poor yield, and an investigation has attributed most defects to the short-circuit between the light-shielding film and the gate electrode and between the light-shielding film and the metallic wiring.

In addition, the light-shielding film for the conventional semiconductor imaging devices is formed of an aluminum thin film with a thickness of about 1 μm. Although this film shields the visible light completely, it is insufficient against some invisible lights. For example, this film transmits 30% or more of X-rays with a 20 angstrom wavelength. If the film thickness is increased to 7 μm, the transmittance of X-rays can be reduced to 0.02%. However, the range of pn-junction plane that does not work for the photoelectric conversion element increases to several microns, and the resulting extremely small opening ratio of the pn-junction plane will end up providing the device with an extremely low sensitivity.

SUMMARY OF THE INVENTION

The present invention is intended to solve the foregoing problems of conventional imaging apparatus using semiconductor imaging devices, and its primary object is to provide an imaging apparatus capable of producing an image signal stably in recording a pulsative optical information having a shorter duration and longer period then the imaging period of the semiconductor imaging device and producing high-quality images of uniform brightness among image fields.

Another object of this invention is to provide an imaging apparatus capable of imaging an object based on an illustration light having such a wavelength as to go through a light-shielding film of the semiconductor imaging device.

Still another object of this invention is to provide an imaging apparatus that can use a high-sensitivity semiconductor imaging device without a light-shielding film.

According to one aspect of this invention, the imaging apparatus comprises a semiconductor imaging device having a plurality of photoelectric conversion elements that produce charges by receiving a light coming from an object to be imaged and a charge readout circuit for reading the charges out of the photoelectric conversion elements, a light generation apparatus for generating the light coming from the object to the photoelectric conversion elements as a pulse-wise light having a predetermined duration, and a control apparatus for controlling the operation of the charge readout circuit and/or light generation apparatus such that the light generation apparatus generates at least one light pulse within one imaging period in which charges are read out of all photoelectric conversion elements.

In the inventive imaging apparatus arranged described above, the imaging light from the object to the imaging device is generated selectively by the light generation apparatus. This means that the object is illuminated by a light of a specific wavelength range, which light is irradiated from the light generation apparatus, and a transmitted or reflected light beam from the illuminated object is focused on the light reception plane of the-imaging device through an optical system, and that, in the case of an object that emits light by itself in response to the excitation by the light generation apparatus, and the light emitted by the object is focused on the light reception plane of the imaging device through the optical system.

According to one preferred form of this invention, the light generation apparatus includes an illumination apparatus for illuminating the object in a pulse-wise manner, and a transmitted or reflected light pulse from the illuminated object is fed to the photoelectric conversion elements.

In the imaging operation of the imaging apparatus arranged as described above, the illumination apparatus emits a pulse-wise illuminating light, and the object is illuminated by the light. A light from the illuminated object (transmitted or reflected light) is fed to the imaging device, converted into charges by the photoelectric conversion elements of the imaging device, and read out as an electrical image signal by the charge readout circuit.

The illumination apparatus and the charge readout circuit of the imaging device are controlled by the control apparatus such that at least one illuminating light pulse is generated within an imaging period in which charges of all photoelectric conversion elements are read out.

In this imaging apparatus, the object is illuminated by at least one illuminating light pulse within an imaging period in which charges of all photoelectric conversion elements are read out, i.e., within an imaging period for producing one image field, and accordingly all image signals produced by the imaging apparatus are derived from the illuminated object without exception and the occurrence of uneven illuminated among image fields can be prevented.

It is of course possible to carry out the illumination based on multiple light pulses within an imaging period, and this scheme provides image signals of the optimal magnitude that matches the characteristics (reflectivity, transmittance, thickness for transmission, etc.) of each object and the output power of each illumination apparatus. If a single illuminating light pulse is not enough to obtain an image signal with a sufficient level, in such a case of a dark light source or optical system of the illumination apparatus or a low transmittance or reflectivity of the object for example, the light generation apparatus is controlled to generate a number of illuminating light pulses in one imaging period. In other words, the inventive imaging apparatus is capable of supplementing the amount of imaging light by adjusting the quantity of signal charges stored in the photoelectric conversion elements of the imaging device in terms of the number of illuminating light pulses in one imaging period of the charge readout circuit.

A conceivable manner of supplementing the amount of imaging light is to sample signal charges produced by the photoelectric conversion in one imaging period out of the imaging device, render the A/D conversion for the signal and integrate the signal numerically. However, this method integrates not only the image signal but noise components that are produced at the output of the imaging device and in the amplifier connected to the imaging device and intermingled with the weak image signal, and necessitates an additional expensive integration circuit.

In contrast, the inventive imaging apparatus is free from the integration of noises of the imaging device and amplifier, and is capable of imposing the S/N characteristics without adding a complex device to the apparatus.

According to another form of this invention, the control apparatus controls the charge readout circuit and/or the light generation apparatus in response to the amount of charges stored in the photoelectric conversion elements. The amount of charges stored in the photoelectric conversion elements can be assessed through the measurement of the amount of illumination light emitted by the illumination apparatus, the amount of light coming from the object to be imaged, or the magnitude of output signal of the imaging device.

In response to a smaller amount of signal charges stored in the photoelectric conversion elements, the control apparatus increases the number of illumination light pulses in one imaging period. The imaging apparatus arranged as described above is capable of producing an image signal that is stabilized automatically at an optimal level and, in addition, the light source in the illumination apparatus is free from an extra duty.

According to still another form of this invention, which is intended for objects that are luminescent substances, the light generation apparatus includes an excitation apparatus for letting the object luminescence in a pulse-wise manner. A pulse-wise light emitted by the object by being energized by the excitation apparatus is fed to the photoelectric conversion elements of the imaging device and, after being transformed into charges by it, an electrical image signal derived from the light is produced by the charge readout circuit.

The excitation apparatus end charge readout circuit have their operations controlled by the control apparatus such that the object emits at least one light pulse within one imaging period in which the charge readout circuit reads out charges of all photoelectric conversion elements.

According to still another form of this invention, the imaging apparatus comprises:

a semiconductor imaging device having a plurality of photoelectric conversion elements that produce charges by receiving a light coming from an object to be imaged, a signal readout circuit for reading the charges sequentially out of the photoelectric conversion elements and a charge transfer circuit for transferring the charges selectively from the photoelectric conversion elements to the signal readout circuit:

a light generation apparatus for generating the light coming from the object to the photoelectric conversion elements; and a control apparatus for operating on the light generation apparatus to let the object emit a light for a predetermined exposure period, operating on the signal readout circuit on completion of the exposure period to evacuate parasitic charges stored in the signal readout circuit, and operating on the charge transfer circuit and the signal readout circuit on completion of the evacuation of the parasitic charges to read out signal charges that have been stored during the exposure period.

The light generation apparatus includes an illumination apparatus that illuminates the object in a pulse-wise manner, for example, and a transmitted or reflected pulse-wise light emitted by the illuminated object is fed to the photoelectric conversion elements.

The photoelectric conversion elements are arranged in a one-dimensional array or a two-dimensional matrix array, for example.

The inventive imaging apparatus arranged as described above operates on the light generation apparatus to produce selectively the imaging light from the object to the imaging device. On receiving the light from the object, the photoelectric conversion elements in the imaging device convert the incident light into charges. The charges are transferred to the signal readout circuit by the charge transfer circuit, and read out from it as an electrical image signal by the signal readout circuit.

The light generation apparatus, charge transfer circuit and signal readout circuit have their operations controlled by the control apparatus.

Specifically, the control apparatus operates on the light generation apparatus to let the object emit light for a prescribed exposure period, operates on the signal readout circuit on completion of the exposure period to evacuate parasitic charges stored in the signal readout circuit, and operates on the charge transfer circuit and signal readout circuit on completion of evacuation of the parasitic charges to read out the signal charges that have been stored in the exposure period.

According to still another preferred form of this invention, the photoelectric conversion elements are arranged in a two-dimensional matrix, for example, add the control apparatus operates on the light generation apparatus to let the object emit a light for a prescribed exposure period and operates on the signal readout circuit to evacuate parasitic charges stored in it during a vertical flyback period of the signal charge readout operation.

According to still another preferred form of this invention, the photoelectric conversion elements are arranged in a two-dimensional matrix, for example, and the control apparatus operates on the light generation apparatus to let the object emit a light for a prescribed exposure period during a first vertical flyback period of the signal charge readout operation, operates on the signal readout circuit to evacuate parasitic charges stored in it during a first scanning period following the first vertical flyback period, and operates on the charge transfer circuit to transfer the signal charges stored in the photoelectric conversion elements to the signal readout circuit and operates on the signal readout circuit to read out the signal charges during a second scanning period following the first scanning period.

According to still another preferred form of this invention, the photoelectric conversion elements are arranged in a two-dimensional matrix, for example, and the control apparatus operates on the light generation apparatus to let the object emit a light for a prescribed exposure period during a first vertical flyback period of the signal charge readout operation, operates on the signal readout circuit to evacuate charges as parasitic charges stored in it during a first scanning period and a successive second scanning period, and operates on the charge transfer circuit to transfer the signal charges stored in the photoelectric conversion elements to the signal readout circuit and operates on the signal readout circuit to read out the signal charges after the beginning of a third scanning period following the second scanning period. In this imaging apparatus, the control apparatus operates on the signal readout circuit to evacuate parasitic charges stored in it after the exposure period, and thereafter the signal charges are read out of the photoelectric conversion elements. Consequently, it becomes possible to read out signal charges without the need of providing the imaging device with a light-shielding film that covers the signal readout circuit, which is needed instead in the conventional imaging apparatus.

The imaging light is not confined to the visible light, but any kind of light including infrared light, ultraviolet light and X-rays can be used. The light generation apparatus can be any device that lets the object emit an imaging light to the imaging device based on a scheme in which the object of imaging is illuminated and the transmitted or reflected light is used for the observation light, or a scheme in which the object of imaging is energized from the outside, e.g., exposed to a laser beam, so that it luminesces, or a scheme in which the observation light is generally shielded and fed to the imaging device only during the exposure period.

These and other features and advantages of the present invention will become more apparent from the following description of preferred embodiments, which are not intended to confine the scope of the invention but are solely for the illustrative purpose, taken in conjunction with the accompanying drawings.

BRIEF DESCRIPTION OF THE DRAWINGS

FIG. 5 is a magnified cross-sectional view taken along the line A—A of FIG. 3;

FIGS. 6A, 6B, 6C and 6D are a set of timing charts showing the timing of operation of the imaging apparatus of the first embodiment;

FIGS. 9A, 9B and 9C are a set of timing charts showing the timing of operation of the imaging apparatus using the imaging device of FIG. 7;

FIG. 10 is a schematic block diagram showing the construction of the imaging apparatus according to a third embodiment of this invention;

DESCRIPTION OF THE PREFERRED EMBODIMENTS

Figure 1:
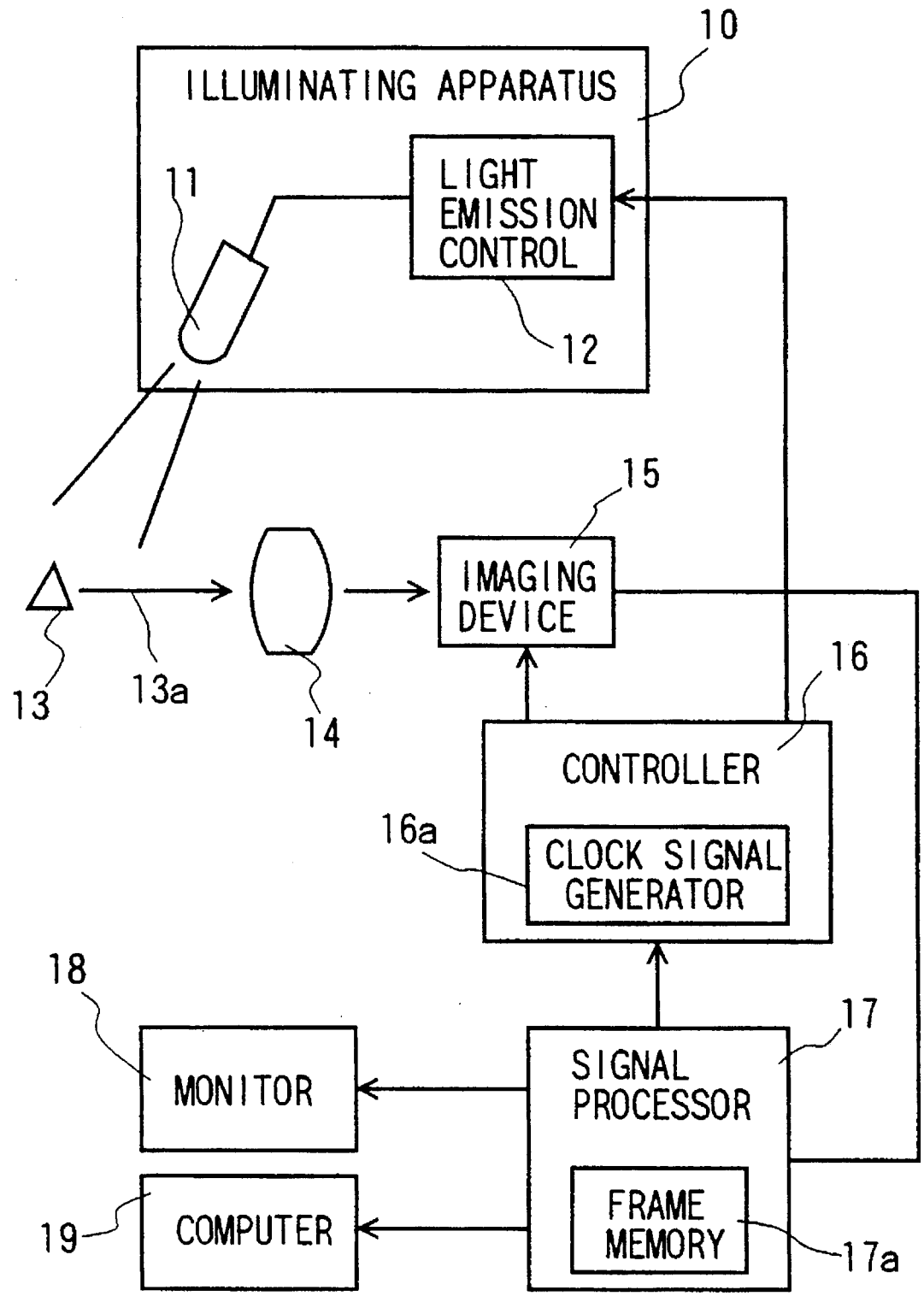
FIG. 1 is a block diagram showing the construction of the imaging apparatus according to first embodiment of this invention.

FIG. 1 is a block diagram showing the arrangement of the imaging apparatus based on the first embodiment of this invention. In the figure, the imaging apparatus comprises an illumination apparatus 10 including a light emitter 11 which emits an illumination light to an object 13 to be imaged and a light emission controller 12 which controls the operation of the light emitter 11, an imaging device 15 which converts a received light into an electrical signal, a controller 16 which controls the illumination apparatus 10 and imaging device 15, an imaging optical system 14 which produces an optical image on the imaging device 15 from the light coming from the object 13, and a signal processor 17 which implements a predetermined processing for the image signal produced by the imaging device 15.

The imaging apparatus of this embodiment arranged as described above operates as follows. The illumination apparatus 10 illuminates the object 13, and the imaging optical system 14 produces an optical image on the imaging device 15. The image is convened into an electrical signal by the imaging device 15, the signal is processed for level adjustment and A/D conversion by the signal processor 17, and the resulting image data is stored in a frame memory 17a included in the signal processor 17. The signal processor 17 measures the amount of signal charges stored in the photoelectric conversion elements of the imaging device 15 based on the image data, and delivers the measured data to the controller 16.

The image data stored in the memory 17a is read out to a monitor display unit 18 or delivered to a computer 19 so that it is numerically analyzed for various purposes. The illumination apparatus 10 is operated to emit the illumination light in synchronism with the signal charge readout operation of the imaging device 15, as will be explained later.

Figure 3:
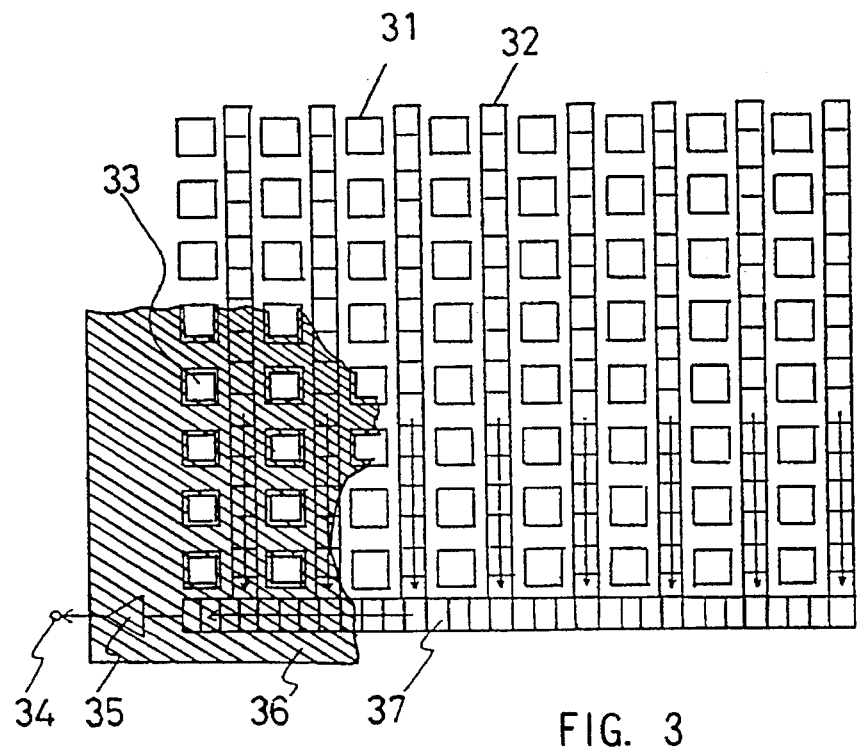
FIG. 3 is a schematic diagram showing part of the imaging device of a first type provided with a light-shielding film.

The imaging device 15 is formed of ITCCD (inter-line transfer charge coupled device) elements as shown in FIG. 3. In the figure, the imaging device consists of numerous photoelectric conversion elements 31 in matrix arrangement for converting received light into charges, vertical charge transfer lines 32 and a horizontal charge transfer line 37 for transferring charges that have been charged in the photoelectric conversion elements, and a light-shielding film 36 made of aluminum or the like for covering optically portions other than the photoelectric conversion elements 31.

Signal charges stored in the photoelectric conversion elements 31 are transferred vertically in parallel by the vertical charge transfer lines 32 and further transferred horizontally as a serial signal by the horizontal charge transfer ling 37, and the signal is led out through an amplifier 35 to an output terminal 34.

Figure 4:
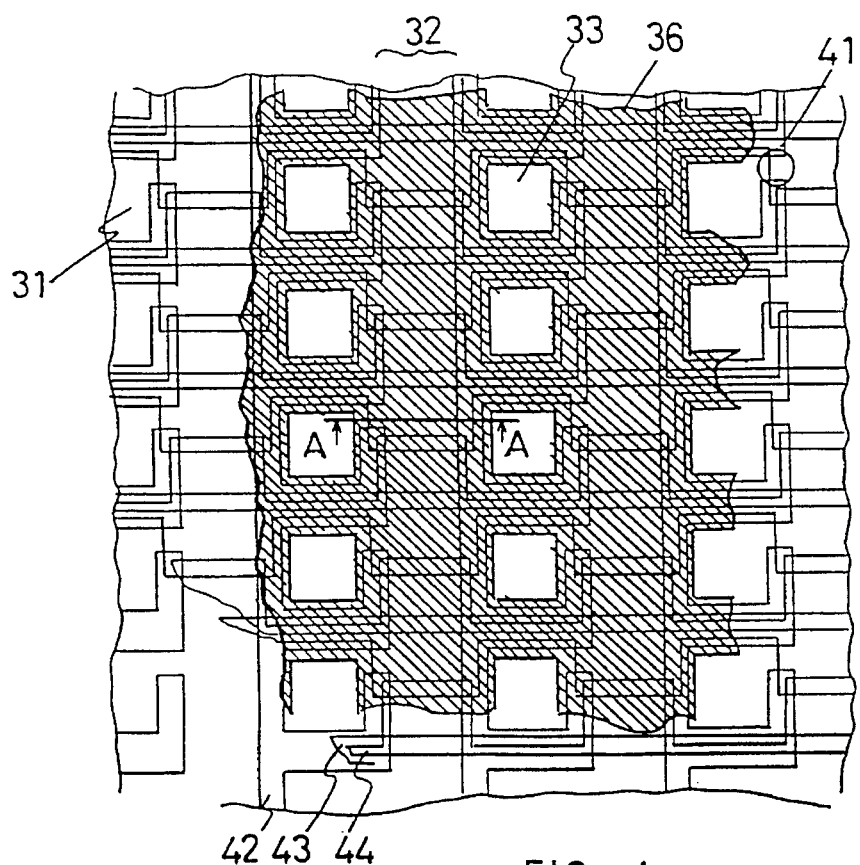
FIG. 4 is a magnified view of part of the light receiving portion of the imaging device shown in FIG. 3.

FIG. 4 is a partial magnified view of the imaging device 15. In the figure, the photoelectric conversion elements 31 are separated from the charge transfer lines 32 by element separation areas 42, and transfer electrodes 43 and 44 of the vertical transfer lines are formed. Each photoelectric element 31 is exposed through an aperture 33 formed in the light-shielding film 36 The light incident to the photoelectric elements 31 through the aperture 33 is converted into charges, which are then transferred over the vertical transfer line 32 through a transfer gate 41 formed of a MOS transistor. The signal charges are read out of the photoelectric elements 31 in a variable interval.

FIG. 5 is a magnified cross-sectional view of the imaging device take along the line A—A of FIG. 4. Formed on a semiconductor substrate 52 are a pn-junction 51 that constitutes an photoelectric conversion element 31, a buried CCD 53 that constitutes a vertical charge transfer line 32, an element separation area 42, a MOS transistor 41 that constitutes a transfer gate, a transfer electrode 43, and a light-shielding film 36 having an aperture 33 over the photoelectric conversion element 31.

FIGS. 6A to 6D show the timing relation of the illuminating and signal readout operations controlled by the controller 16 of the imaging apparatus of the first embodiment. FIG. 6A shows the timing of light emission of the illumination apparatus 10, FIG. 6B shows the timing of charge transfer from the photoelectric conversion element 31 to the vertical transfer lines 32 by the transfer gates, FIG. 6C shows the timing of activation of the vertical transfer lines 32, and FIG. 6D shows the timing of signal readout from the imaging device 15. Each timing chart has a horizontal time axis.

In FIG. 6A, the light emitter 11 emits light pulses during time periods shown by the high-level waveform (H) in a constant interval of T (light generation period). In FIG. 6B, signal charges are transferred from the photoelectric conversion elements 31 to the vertical transfer lines 32 during time periods shown by the high-level waveform.

The illumination apparatus 10 operates in synchronism with the the imaging device 15, as mentioned previously. The controller 16 includes a reference clock oscillator 16a (e.g., a crystal oscillator) of several megahertz, and this clock signal is demultiplied to produce a timing signal (shown in FIG. 6B) for transferring the signal charges from the photoelectric conversion elements 31 to the vertical transfer lines 32. This timing signal is further demultiplied to produce a vertical sync signal of 30 Hz.

The vertical sync signal is demultiplied by 3 separately to produce a timing signal of 10 Hz (shown in FIG. 6A) for the activating of the illumination apparatus 10. Accordingly, the timing signal for illumination light emission originates from the reference clock signal that is also the base of the timing signal for signal transfer from the photoelectric conversion elements 31 to the vertical transfer lines 32. Therefore, the timing signal for illumination (FIG. 6A) and the timing signal for signal charge transfer (FIG. 6B) are synchronous and have a fixed phase difference.

In FIG. 6B, the timing signal pulses 6e, 6f and 6g are generated in constant inteval at the general condition. Although this interval has the same period as the light generation period or period T of the illumination timing signal (FIG. 6A), a plurality of illumination timing signal pulses may be generated within each of the constant intevals of the transfer timing signal at general condition.

In the imaging apparatus of the first embodiment, the controller 16 eliminates a pulse 6f among pulses of the transfer signal (which drives the MOS transistor 41 of transfer gate) to extend the imaging period into twice of the former period, as shown in FIG. 5B. Consequently, the photoelectric conversion elements 31 receive twice as many illuminating light pulses in one signal readout period (imaging period) and, thus, the amount of signal charges is doubled.

The controller 16 can vary the number of illumination light pulses in one imaging period depending on the purpose of imaging, e.g., it can eliminate two consecutive pulses 6f and 6g to extend the imaging period into treble of the former period so that the object 13 is illuminated by triple of the illuminating light pulses in one imaging period. Accordingly, this imaging apparatus is operative to increase the number of illuminating light pulses in one imaging period (readout period) based on the measured signal provided by the signal processor 17 so that an image signal having a proper luminance level can be obtained when the light coming from the object is insufficient.

In this embodiment, the signal transfer lines 32 and 37 are driven invariably regardless of the generation of a charge readout timing pulse (FIG. 6B) for the photoelectric conversion elements 31, as shown in FIG. 6C. Accordingly, in case a charge readout pulse 6f is eliminated, a readout sisal 6h does not carry image information, but it is instead device 15 does not carry image information, but it is instead a dark output signal transferred over the vertical and horizontal transfer lines 32 and 37. The dark output signal is useless as image data and it is rejected from being stored in the frame memory 17a of the signal processor 17.

Alternatively, the signal processor 17 may be designed to store all image data from the imaging device 15 into the frame memory 17a, with dark image data transferred together with effective image data 6i over the transfer lines 32 and 37 being removed afterward.

Figure 7:
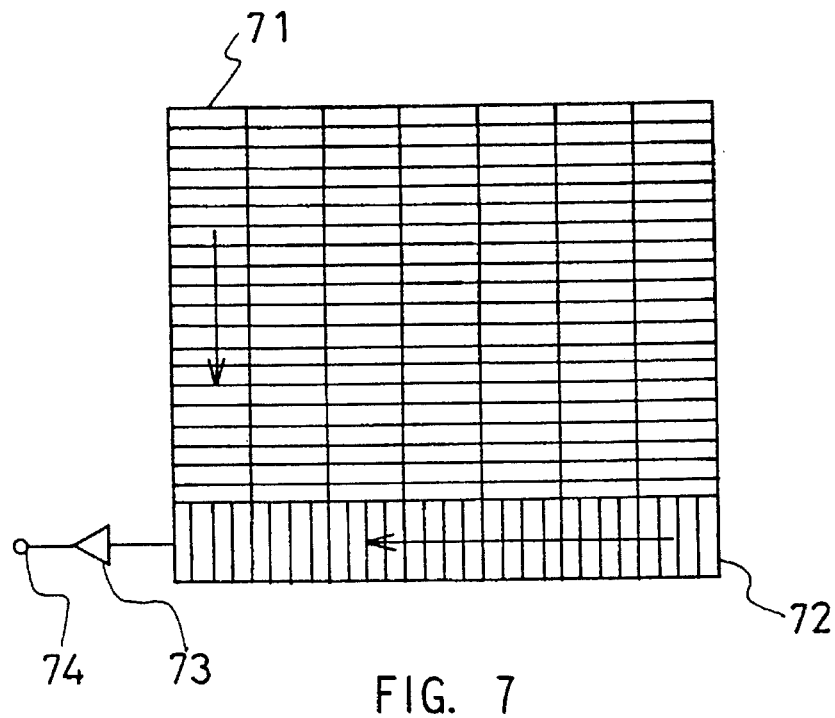
FIG. 7 is a schematic diagram showing part of the imaging device of a second type.

The ITCCD elements of the imaging device shown in FIG. 3 through FIG. 5 may be replaced with FTCCD (frame transfer charge coupled device) elements. FIG. 7 schematically shows the arrangement of the FTCCD-based imaging device. This imaging device is provided with vertical CCDs 71 which transfer signal charges vertically and horizontal CCDs 72 which transfer signal charges horizontally as shown by the arrows. The figure shows seven vertical CCD arrays.

Figure 8:
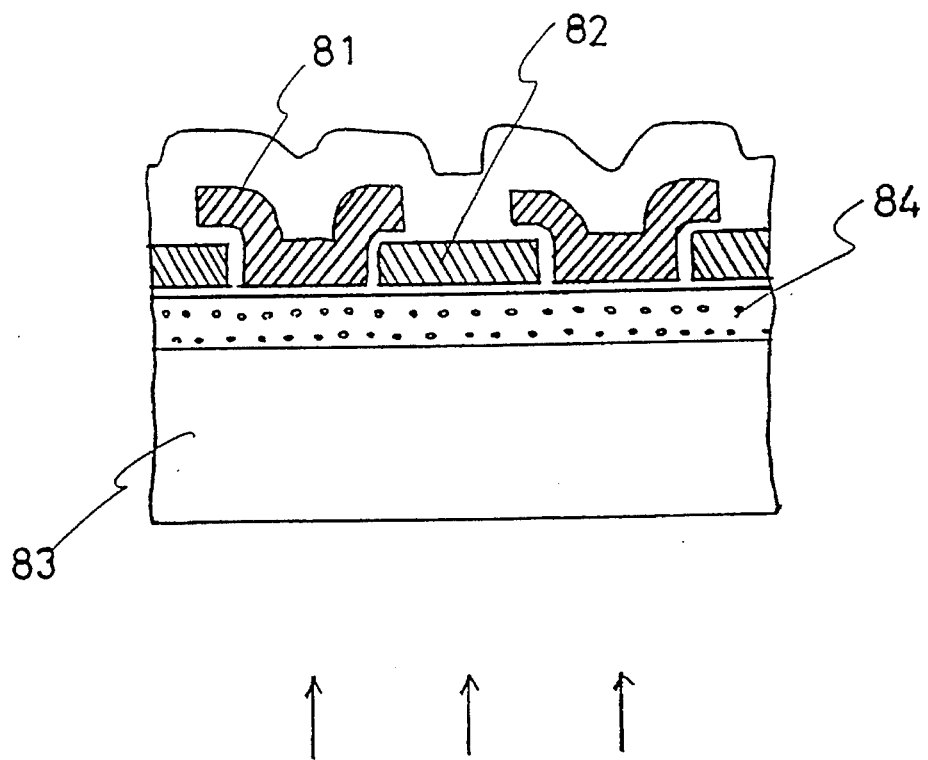
FIG. 8 is a magnified cross-sectional view of part of the imaging device of FIG. 7.

FIG. 8 shows the principal cross-sectional structure of the FTCCD-based imaging device in the same depictive manner as FIG. 5. The FTCCD elements are different from the ITCCD elements explained previously in that electrode lines 81 and 82 are formed on two layers and a diffusion layer 84 of opposite conductivity type is formed on the surface of the semiconductor substrate 83 so that vertical and horizontal transfer lines are formed as buried channel CCD elements, instead of the photoelectric conversion elements being formed independently. In response to a voltage applied to the electrodes 81 and 82, a potential well is created beneath the electrodes, and it serves to store and transfer signal charges.

In case of the imaging device using the FTCCD, the light conducted from the object 13 to the imaging device 15 by the imaging optical system 14 is incident to the substrate 83 from the back of the CCD elements as shown by the arrow in FIG. 8, and creates electrons and holes in the substrate. Depending on the conductivity type of the semiconductor substrate 83 and the voltage polarities of the electrodes 81 and 82, either electrons or holes are stored as charges in the potential well beneath the electrodes, and the charges are read out as an image signal. Since the charge storage section and signal charge transfer section share the area, a pixel (smallest unit of phoptoelectric conversion element) can be made smaller as compared with the ITCCD array, and consequently the spatial resolution can be upgraded.

The FTCCD array has no associated transfer gates transistors) for controlling the transfer of signal charges to the vertical transfer lines, and therefore its drive manner is different from that of the ITCCD array, as will be explained with reference to FIGS. 9A to 9C.

FIG. 9A shows the timing signal for illumination light emission by the illumination apparatus, FIG. 9B shows the timing signal for activating the charge transfer lines, and FIG. 9C shows the timing signal for image signal readout from. the device. Each timing chart has a horizontal time axis. In FIG. 9A, the light emitter 11 emits light pulses during time periods shown by the high-level waveform (H) in a constant interval of T, as in the case of FIG. 6A.

If the FTCCD is used as the imaging device, the signal charges are transferred faster, as compared with the timing of illumination, in synchronism with illumination. The signals 9d to 9f in FIG. 9B show the drive pulses thus generated.

When the controller 16 suspends a series of drive pulses 9e, for example, signal charges for two illuminating pulses can be stored in the potential well of the vertical transfer CCD array shown in FIG. 8, and resulting image signals 9g are obtained as shown in FIG. 9C.

Accordingly, the inventive imaging apparatus can be accomplished by employment of FTCCD as well as ITCCD for the imaging device.

Still another type of imaging device based on FITCCD (frame inter-line transfer charge coupled device) elements and X-Y addressing imaging device typified by the MOS-type imaging device can be used.

The imaging apparatus may include. an additional device for measuring the amount of illumination light produced by the illumination apparatus 10, the amount of light coming from the object 13 or the magnitude of the output signal read out of the imaging device 15. In this case, the controller 16 may be designed to assess the amount of signal charges stored in the photoelectric conversion elements of the imaging device based on the output signal of the measuring device and control the operation (readout of charges) of the imaging device in accordance with the result of assessment. Consequently, it becomes possible to increase the number of illuminating light pulses in one imaging period when the amount of signal charges stored in the photoelectric conversion elements is small, thereby obtaining an image signal that is stabilized automatically at an optimal level.

Figure 2:
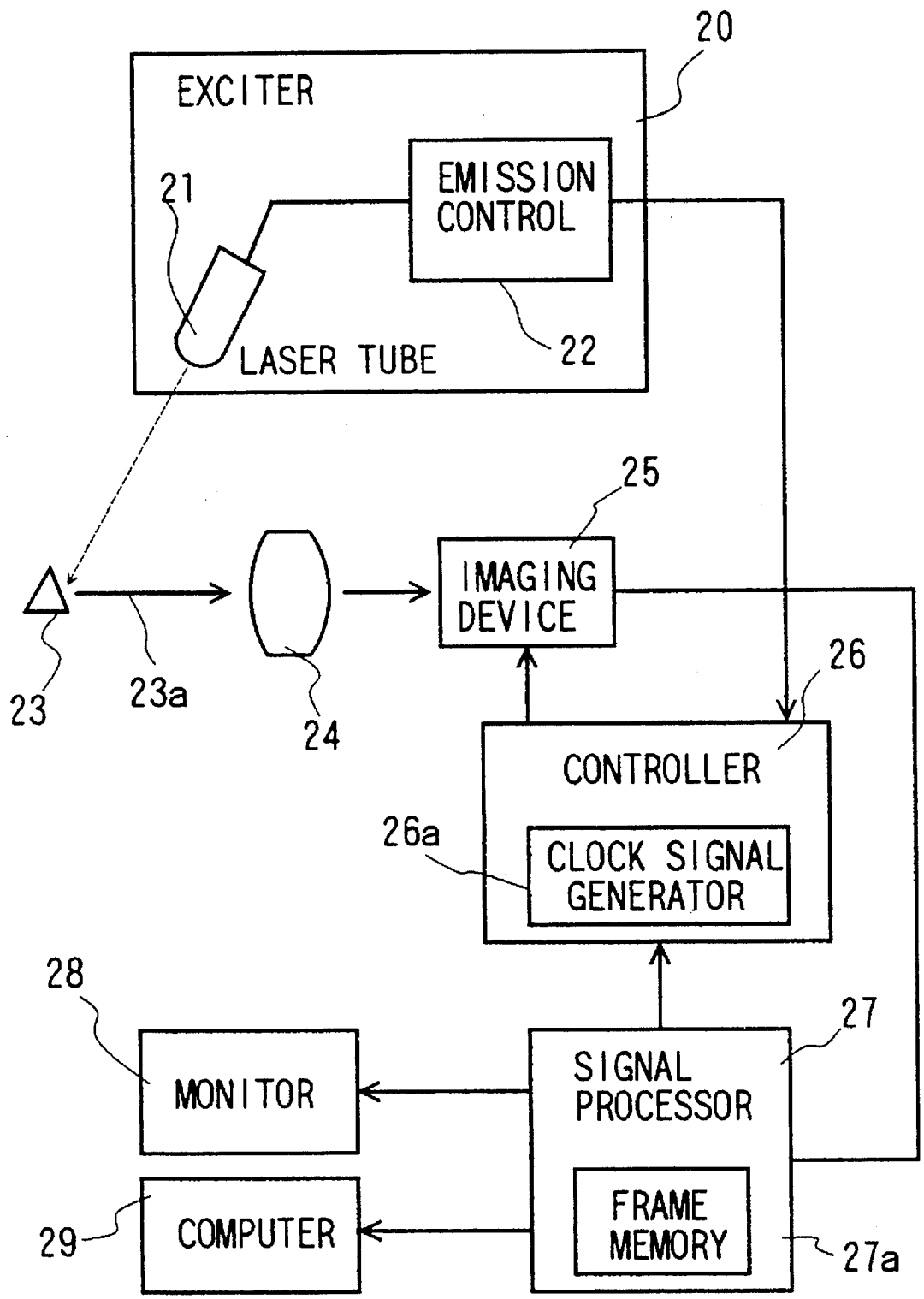
FIG. 2 is a block diagram showing the construction of the imaging apparatus according to a second embodiment this invention.

FIG. 2 shows the arrangement of the imaging apparatus according to the second embodiment of this invention. This imaging apparatus is intended for objects that emit light by themselves by being energized by a laser light, and it uses an exciter (light generation apparatus) 20 consisting of a laser tube 21 which projects a laser beam on to an object 23 and an emission controller 22 which controls laser emission.

This imaging apparatus further includes an imaging device 25 which transforms a received light into an electrical signal, a controller 26 which controls the exciter 20 and imaging device 25, an imaging optical system 24 which produces an optical image on the light reception plane of the imaging device 25 from the light coming from the object 23, and a signal processor 27 which implements a predetermined processing for the image signal produced by the imaging device 25.

In contrast to the imaging apparatus of the first embodiment, in which the operation of the illumination apparatus (emission of illuminating light) is synchronized to the operation of the imaging device (readout of signal charges), the imaging device 25 of the second embodiment is synchronized to the exciter 20 which serves as a light emission apparatus. This imaging apparatus is capable of producing an image signal of a stable level as in the case of the first embodiment.

Although the imaging device of the inventive imaging apparatus is operative at the room temperature (around 20° C.), if storing of signal charges in the photoelectric conversion elements takes a long time because of a low intensity of light received by the imaging device, or a dark imaging optical system, or a deficient incident light to the imaging device due to much absorption of excitation energy by the object, or if the operation of the signal charge transfer lines and signal charge readout means is halted as is the case explained on FIG. 9, then it is desirable to cool the imaging device with some means so as to minimize the dark current (a current created by thermally excited charges).

Figure 11:
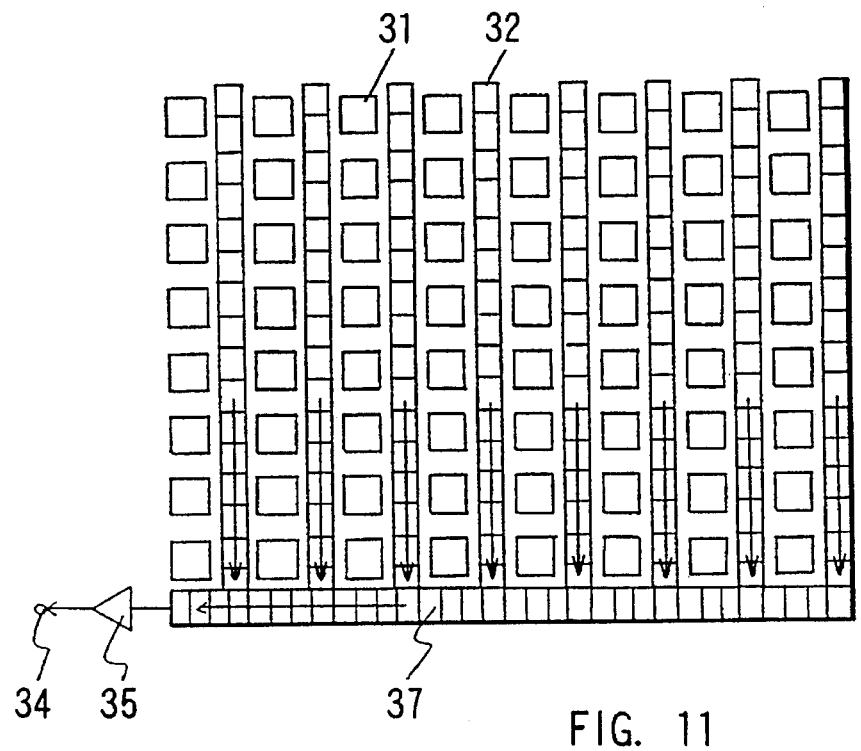
FIG. 11 is a schematic diagram showing the principal portion of the imaging device that has no light-shielding film and is used for the imaging apparatus of the third embodiment.
Figure 12:
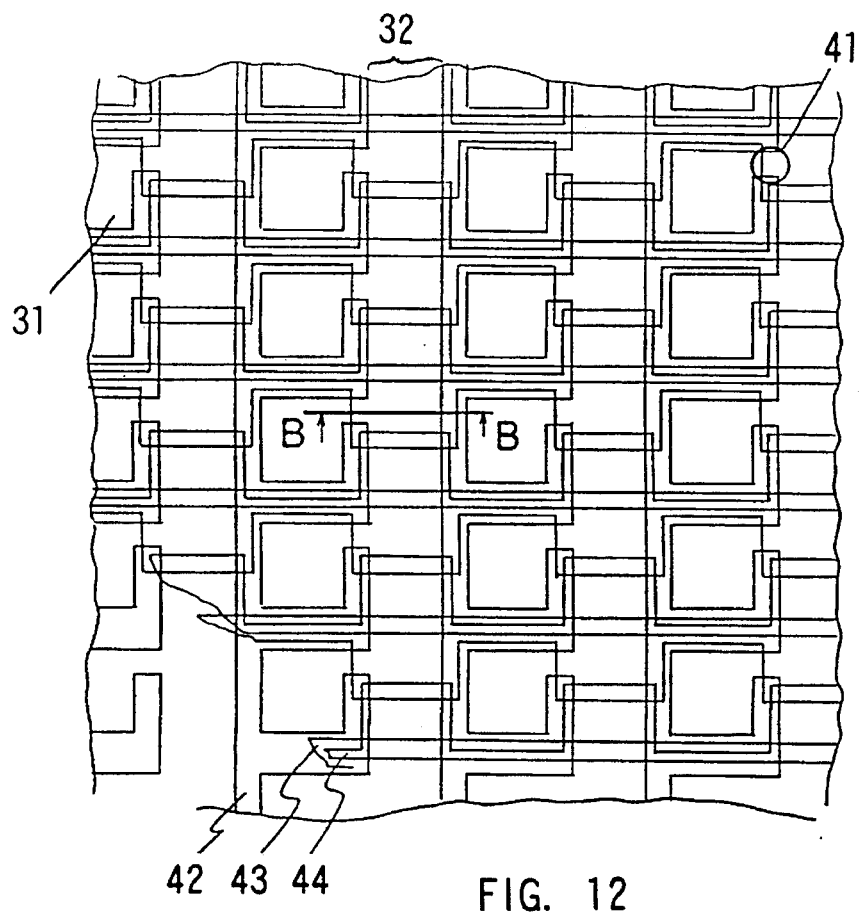
FIG. 12 is a magnified view of part of the imaging device shown in FIG. 11.
Figure 13:
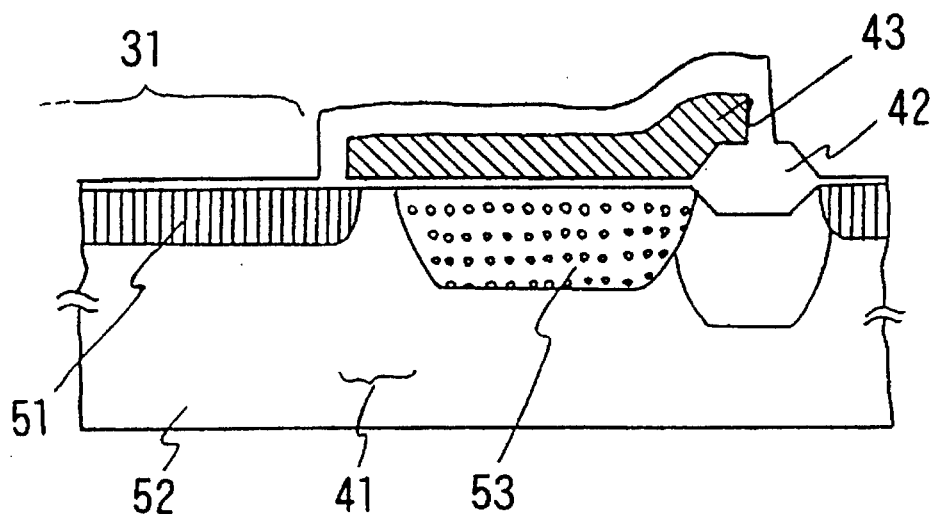
FIG. 13 is a magnified cross-sectional view taken along the line B—B of FIG. 12.

Although the imaging devices of the foregoing embodiments have a light-shielding film as shown in FIG. 3, it is possible according to this invention to configure an imaging apparatus that operates normally even without the provision of a light-shielding film through the setting of operational timing to the controller such that the light from the object is not fed to the imaging device during the signal charge transfer period and signal charge readout period (e.g., by disabling the fabricating process of the imaging device consequently the fabricating process of the imaging device can be simplified and the sensitivity of the apparatus can be enhanced owing to much efficient use of the photoelectric conversion area, FIG. 10 shows schematically the arrangement of the imaging apparatus using an imaging device without the formation of a light-shielding film according to the third embodiment of this invention, FIG. 11 shows schematically the principal structure of the imaging device without the light-shielding film used for this imaging apparatus, FIG. 12 is a partial magnified view of the imaging device, and FIG. 13 is a magnified cross-sectional view taken along the line B—B of FIG. 12.

This imaging apparatus comprises an illumination apparatus 110 including an illuminating light pulse emitter 101 which projects an illuminating light on to an object 103 to be imaged and an emission controller 102 which controls the operation of the light emitter 101, an imaging device 105 which converts a received light into an electrical signal, a controller 106 which controls the illumination apparatus 100 and imaging device 105, and an imaging optical system 104 which produces an optical image on the imaging device 105 from the light coming from the object 103. The imaging device 105, imaging optical system 104 and controller 106 are assembled in a camera unit 100, and the image signal produced by the imaging device 105 is led out through an output terminal 107 to an external memory or signal processor (not shown).

The imaging device 105 is formed of inter-line transfer CCD elements and associated photoelectric conversion elements arranged in a two-dimensional matrix on a semiconductor substrate. The imaging device may not have a light-shielding film as will be explained later.

The illumination apparatus 110 including the light pulse emitter 101 and emission controller 102 constitutes the light emission apparatus mentioned previously, and the illumination apparatus 110 add imaging device 105 are operated synchronously by the controller 106, as will be explained in detail later.

The imaging device 105 differs from those of the first and second embodiments, which have been explained in connection with FIG. 3 through FIG. 5, solely in the absence of the light-shielding film 36, as will be appreciated from FIG. 11 through FIG. 13. In these figures, portions corresponding to those of FIG. 3 through FIG. 5 are referred to by the common symbols, and detailed explanation thereof is omitted.

This imaging apparatus produces a stable image signal, despite the absence of the light-shielding film for the imaging device 105, based on the light emission control and imaging control by the controller 106 as follows.

Figure 14A:
FIGS. 14A through 14E are a set of timing charts showing the timing of operation of the imaging apparatus of the third embodiment.
Figure 14B:
Figure 14C:
Figure 14D:
Figure 14E:

FIG. 14A through FIG. 14E show, as an example, the operation of this imaging apparatus. FIG. 14A shows the timing of light emission of the illumination apparatus 110, indicating the time periods of the emission of illuminating light pulses to the object 103 at the high-level waveform. FIG. 14B shows the timing of signal readout from the imaging device, indicating the time periods of signal readout at the high-level waveform and the flyback periods by the low-level waveform. FIG. 14C shows the timing of charge transfer from the vertical transfer lines 32 to the horizontal transfer line 37. FIG. 14D shows the timing of charge transfer from the photoelectric conversion elements 31 to the signal readout circuit (vertical transfer lines 32), indicating the charge transfer at the high-level waveform. FIG. 14E shows the waveform of the image signal led out to the output terminal 107, indicating the effective signal sections at the high-level waveform.

As shown in FIG. 14A, the controller 106 operates on the light emitter 101 through the emission controller 102 to illuminate the object 103 for a prescribed duration within the vertical flyback period. When a reflected light pulse (or transmitted light pulse) from the illuminated object 103 is fed to the imaging device 105 without a light-shielding film byway of the imaging optical system 104, it creates charges in the photoelectric conversion elements and its periphery that are exposed to the incident light. As shown in FIGS. 14B and 14C, pulses are applied to the vertical transfer lines 32 and horizontal transfer line 37 (signal readout circuit) on completion of the light exposure within the vertical flyback period, and charges that have been stored as parasitic charges on the vertical transfer lines 32 and horizontal transfer line 37 during the light pulse exposure period are evacuated through the output terminal 107 in a short time.

After the parasitic charges have been evacuated, charges stored in the photoelectric conversion elements 31 are shifted to the vertical transfer lines 32 in response to the gate pulse shown in FIG. 14D. Subsequently, charges (signal charges) placed on the vertical transfer lines 32 are shifted onto the horizontal transfer line 37 in response to the transfer pulses within the scanning period shown in FIG. 14C, and a serial image signal shown in FIG. 14E is led out through the output terminal 107. It should be noted that FIG. 14C shows parasitic charge readout pulses and signal charge readout pulses on the same time axis.

According to the imaging apparatus of this embodiment, parasitic charges stored on the vertical and horizontal transfer lines 32 and 37 are evacuated by the controller 106 on completion of the exposure period and thereafter signal charges stored in the photoelectric conversion elements 31 are read out, and consequently it becomes possible for the apparatus without the provision of a light-shielding film for covering the vertical and horizontal transfer lines to read out the signal charges normally.

This imaging apparatus does not necessitate the light-shielding area 61 to surround each photoelectric conversion element (refer to FIG. 5), which is included in the imaging device shown in FIG. 3 through FIG. 5, and consequently an increased area of the imaging device contributes to the photoelectric conversion and the sensitivity of imaging can be enhanced.

It also eliminates the need of providing a light-shielding film of an increased thickness in the case of using an illumination light of a certain wavelength range, e.g., X-ray, that transmits the usual light-shielding film.

The absence of the light-shielding film eliminates short-circuits between the light-shielding film and the gate electrode or internal metallic wire, and the manufacturing of imaging devices achieves an enhanced yield.

It is desirable for the imaging apparatus of this embodiment to cool the imaging device 105 so that fake signal charges attributable to the dark current generated in the photoelectric conversion elements 31 is reduced. Consequently, the time period of light entry to the photoelectric conversion elements can be extended, and the timing control for the reception of light from the object and the operation of the imaging device 105 is relaxed.

Figure 15A:
FIGS. 15A through 15E are a set of timing charts showing the timing of operation of the imaging apparatus based on a modified embodiment.
Figure 15B:
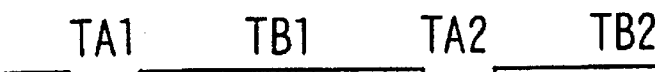
Figure 15C:
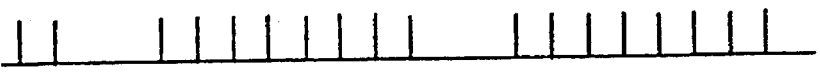
Figure 15D:
Figure 15E:

As a modified embodiment derived from the third embodiment, the controller 106 controls the devices as shown on the timing charts of FIGS. 15A through 15E. FIG. 15A shows the timing of light emission of the illumination apparatus 110, indicating the time periods of the emission of illumination light to the object 103 at the high-level waveform. FIG. 15B shows the timing of image signal readout from the imaging device, indicating the time periods of signal readout at the high-level waveform and the flyback periods at the low-level waveform. FIG. 15C shows the timing of charge transfer from the vertical transfer lines 32 to the horizontal transfer line 37. FIG. 15D shows the timing of charge trampler from the photoelectric conversion elements 31 to the signal readout circuit (vertical transfer lines 32), indicating the transfer of charges at the high-level waveform. FIG. 15E shows the waveform of the image signal led out to the output terminal 107, indicating the effective signal sections at the high-level waveform.

As shown in FIG. 15B, an operation cycle of the imaging device 105 includes a first vertical flyback period TA1, a first scanning period TB1, a second vertical flyback period TA2 and a second scanning period TB2 in this order, and the scanning period and vertical flyback period further iterate alternately. The controller 106 of this variant embodiment activates constantly the vertical transfer lines 32 and horizontal transfer line 37 as the signal readout means, as shown in FIG. 15C. The controller 106 also operates on the illumination apparatus 110 so that the light emitter 101 illuminates the object 103 for a prescribed duration within the first vertical flyback period TA1 as shown in FIG. 15A, and evacuates charges, which have been read out in the first scanning period TB1, as parasitic charges. Subsequently, the controller 106 issues a gate pulse shown in FIG. 15F at the beginning of the second scanning period TB2 to activate the charge transfer gate 41 thereby to transfer signal charges of the photoelectric conversion elements 32 to the vertical transfer lines 32, and reads out the signal charges in response to readout pulses in the second scanning period TB2 shown in FIG. 15C to obtain the image signal as shown in FIG. 15E.

The control operation of the controller 106 based on this modified embodiment eliminates the need of a light-shielding film, as in the case of explanation on FIG. 14. The modified embodiment of FIG. 15 further eliminates the need of quick activation of the signal readout means (charge transfer lines) within the vertical flyback period in order to evacuate parasitic charges stored in it, and consequently the imaging device drive circuit can be simplified.

Figure 16A:
FIGS. 16A through 16E are a set of timing charts showing the timing of operation of the imaging apparatus based on another modified embodiment.
Figure 16B:
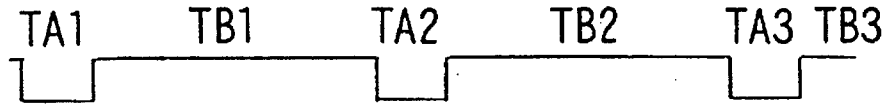
Figure 16C:
Figure 16D:
Figure 16E:

As another modified embodiment derived from the third embodiment, the controller 106 controls the devices as shown on the timing charts of FIGS. 16A through 16E. FIG. 16A shows the timing of light emission of the illumination apparatus 110, indicating the time periods of the emission of illumination light to the object 103 at the high-level waveform. FIG. 16B shows the timing of image signal readout from the imaging device, indicating the time periods of signal readout at the high-level waveform and the flyback periods at the low-level waveform. FIG. 16C shows the timing of charge transfer from the vertical transfer lines 32 to the horizontal transfer line 37. FIG. 16D shows the timing of charge transfer from the photoelectric conversion elements 31 to the signal readout circuit (vertical transfer lines 32), indicating the charge transfer at the high-level waveform. FIG. 16E shows the waveform of the image signal led out to the output terminal 107, indicating the effective signal sections at the high-level waveform.

The controller 106 of this modified embodiment activates constantly the vertical transfer lines 32 and horizontal transfer line 37 as the signal readout circuit, as shown in FIG. 16C. The controller 106 also operates on the illumination apparatus 110 so that the light emitter 101 illuminates the object 103 for a prescribed duration as shown in FIG. 16A. The controller 106 evacuates charges, which have been read out in the first scanning period TB1 and second scanning period TB2 as parasitic charges as shown in FIG. 16C, issues a gate pulse at the beginning of the third scanning period TB3 as shown in FIG. 15F to activate the charge transfer gate 41 thereby to transfer signal charges of the photoelectric conversion elements 31 to the vertical transfer lines 32 as shown in FIG. 16D, and reads out the signal charges in response to readout pulses in the third scanning period TB3 shown in FIG. 16C to obtain the image signal as shown in FIG. 15E.

Although the third embodiment and its two modified embodiments have been explained for the case of imaging an object 103 successively by illuminating it pulsatively at a constant interval, this invention is also applicable to the imaging based on a single illumination light pulse. In this case, it is desirable to evacuate residual charges in the photoelectric conversion elements in advance of entry of the light from the object to the photoelectric conversion elements of the imaging device.

In evacuating parasitic charges from the signal readout means, these charges may be either transferred in the same direction as the signal charges on the vertical transfer lines, as in the foregoing embodiments, or transferred in the direction opposite to signal charges and evacuated through drain terminals provided at another end of the vertical transfer lines.

This invention is not confined to imaging apparatus using a planar imaging device in which numerous photoelectric conversion elements are arranged in a two-dimensional matrix as explained above for the embodiments, but it is of course applicable to imaging apparatuses using a linear imaging device in which numerous photoelectric conversion elements are aligned to form a one-dimensional array.

Moreover, the inventive imaging apparatus can use all kinds of imaging devices in which photoelectric conversion elements and a signal readout circuit can separately be treated functionally, and the structure of imaging device is not confined to those explained in the foregoing embodiments.

Examples of imaging devices useful for the inventive imaging apparatus include an imaging device of the top-surface incidence type in which the imaging light is incident to the device through the top surface of the device, an imaging device of the back-surface type in which the imaging light is incident to the device through the back surface of the device, an imaging device of the x-y scanning type typified by the MOS-type device, a device based on inter-line transfer CCDs, and a device based on frame transfer CCDs.

For imaging devices based on X-ray imaging, it is not necessary to carry out the device test following the fabrication by using the X-ray for all test items, but the visible light may be used if it suffices the purpose. The performance test of imaging devices using the X-rays necessitates a large-scale preparation inclusive of the X-ray source and human protection facility. On this account, the final test using X-rays is preceded by preliminary tests including the chip selection based on the visible light. In the visible-light test, it is possible to apply the continuous visible light, instead of pulsative light, to the photoelectric conversion elements of the imaging device.

For example, by forming a light-shielding film that blocks the visible light completely but transmits the X-ray on the surface of the imaging device, it becomes possible to carry out the chip selection test through the continuous illumination nation of the visible light and carry out the final X-ray based characteristic test.

In this case, a thin film of aluminum with a thickness of 0.5 μm, for example, with apertures being formed therein at positions over the photoelectric conversion elements, is formed for shielding the visible light applied to the signal readout circuit portion. When the X-rays with a 20-angstrom wavelength as used for the illumination light, the 0.5 μm aluminum thin film transmits 57% or more of the X-ray illumination light and it does not work as a light-shielding film.

What is claimed is:

1. An imaging apparatus comprising:

a semiconductor imaging device having a plurality of photoelectric conversion elements that produce charges by receiving light coming from an object to be imaged, and a charge readout circuit for reading the charges out of said photoelectric conversion elements;

a light generation apparatus for generating said light coming from said object to said photoelectric conversion elements as a pulse-wise light having a predetermined constant duration and a predetermined constant period; and a control apparatus for controlling operation of at least one of said charge readout circuit and said light generation apparatus such that said light generation apparatus generates at leas one light pulse within one imaging period in which charges are read out of said photoelectric conversion elements.

2. An imaging apparatus according to claim 1, wherein said light generation apparatus includes an illumination apparatus for illuminating said object in a pulse-wise manner, light which is emitted from said illuminated object in said pulse-wise manner being fed to said photoelectric conversion elements base on illumination by said illumination apparatus.

3. An imaging apparatus according to claim 2, wherein said control apparatus controls said illumination apparatus and said charge readout circuit of said imaging device such that at least one illuminating light pulse is generated within one imaging period in which charges are read out of said photoelectric conversion elements by said charge readout circuit.

4. An imaging apparatus according to claim 1, wherein said control apparatus controls at least one of said charge readout circuit and said light generation apparatus depending on the amount of charges stored in said photoelectric conversion elements.

5. An imaging apparatus according to claim 1, wherein said light generation apparatus includes an excitation apparatus that causes an object to be imaged, said object having a property of luminescence, by being excited, so that it emits light in a pulse-wise manner.

6. An imaging apparatus comprising:

a semiconductor imaging device having a plurality of photoelectric conversion elements that create charges by receiving light coming from an object to be imaged, a signal readout circuit for reading the charges sequentially out of said photoelectric conversion elements, and a charge transfer circuit for transferring the charges selectively from said photoelectric conversion elements to said signal readout circuit;

a light generation apparatus for generating said light coming from said object to said photoelectric conversion elements; and a control apparatus for operating on said light generation apparatus to let said object emit light for a predetermined exposure period, operating on said signal readout circuit on completion of the exposure period to evacuate parasitic charges stored in said signal readout circuit, and operating on said charge transfer circuit and said signal readout circuit on completion of evacuation of the parasitic charges to read out signal charges that have been stored during the exposure period.

7. An imaging apparatus according to claim 6, wherein said light generation apparatus includes an illumination apparatus for illuminating said object in a pulse-wise manner, light which is emitted from said illuminated object in said pulse-wise manner being fed to said photoelectric conversion elements based on illumination by said illumination apparatus.

8. An imaging apparatus according to claim 6, wherein said photoelectric conversion elements are arranged in a one-dimensional array.

9. An imaging apparatus according to claim 6, wherein said photoelectric conversion elements are arranged in a two-dimensional matrix array.

10. An imaging apparatus according to claim 9, wherein said control apparatus operates on said light generation apparatus to let said object emit light for a predetermined exposure period and operates on said signal readout circuit to evacuate parasitic charges stored in said signal readout circuit with a predetermined period at a readout of the signal charges.

11. An imaging apparatus according to claim 9, wherein said control apparatus operates on said light generation apparatus to let said object emit light for a predetermined exposure period within a predetermined period at the readout of the signal charges, operates on said signal readout circuit to evacuate charges stored in said signal readout circuit as parasitic charges during a first scanning period following said predetermine a period and operates on said charge transfer circuit to transfer the signal charges stored in said photoelectric conversion elements to said signal readout circuit and operates on said signal readout circuit to read out the signal charges during a second scanning period following said first scanning period.

12. An imaging apparatus according to claim 9, wherein said control apparatus operates on said light generation apparatus to let said object emit light for a predetermined exposure period during a first scanning period at the readout of the signal charges, operates on said signal readout circuit to evacuate charges stored in said signal readout circuit as parasitic charges during the first scanning period and a second scanning period following the first scanning period, and operates on said charge transfer circuit to transfer the signal charges stored in said photoelectric conversion elements to said signal readout circuit and operates on said signal readout circuit to read out the signal charges after the beginning of a third scanning period following the second scanning period.

13. An imaging apparatus according to claim 9, wherein said imaging device has no light-shielding film for covering said signal readout circuit against the light generated by said light generation apparatus.

\* \* \* \* \*